(12) United States Patent
Lin et al.

(10) Patent No.: US 9,305,635 B2
(45) Date of Patent: Apr. 5, 2016

(54) HIGH DENSITY MEMORY STRUCTURE

(71) Applicant: Taiwan Semiconductor Manufacturing Co., Ltd., Hsin-Chu (TW)

(72) Inventors: Yangsyu Lin, New Taipei (TW); Hsiao Wen Lu, Guishan Township (TW); Chiting Cheng, Taichung (TW); Jonathan Tsung-Yung Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 225 days.

(21) Appl. No.: 14/068,003

(22) Filed: Oct. 31, 2013

(65) Prior Publication Data

US 2015/0121030 A1    Apr. 30, 2015

(51) Int. Cl.
*G11C 5/06* (2006.01)
*G11C 11/419* (2006.01)
*G11C 7/18* (2006.01)

(52) U.S. Cl.
CPC ............... *G11C 11/419* (2013.01); *G11C 7/18* (2013.01)

(58) Field of Classification Search
CPC ............ G11C 8/12; G11C 7/18; G11C 7/1006
USPC .................... 365/63, 230.03, 189.02, 203
See application file for complete search history.

(56) References Cited

U.S. PATENT DOCUMENTS

| 7,177,225 B2 * | 2/2007 | Terzioglu et al. | 365/230.06 |
| 8,520,449 B2 * | 8/2013 | Kajigaya | 365/189.04 |
| 8,897,082 B2 * | 11/2014 | Koike | 365/189.15 |

* cited by examiner

*Primary Examiner* — Son Dinh
(74) *Attorney, Agent, or Firm* — Duane Morris LLP

(57) ABSTRACT

A semiconductor memory comprises a plurality of sub banks each including one or more rows of memory bit cells connected to a set of local bit lines, wherein the sub banks share a same set of global bit lines for reading/writing data from/to the memory bit cells of the sub banks. The semiconductor memory chip further comprises a plurality of switch elements for each of the sub banks, wherein each of the switch elements connects the local bit line and the global bit line of a corresponding one of the memory bit cells in the sub bank for data transmission between the local bit line and the global bit line. The semiconductor memory chip further comprises a plurality of bank selection signal lines each connected to the switch elements in a corresponding one of the sub banks, wherein the bank selection signal lines carry a plurality of bank selection signals to select one of the sub banks for data transmission between the local bit lines and the global bit lines.

20 Claims, 7 Drawing Sheets

HIGH DENSITY MEMORY STRUCTURE

FIELD OF DISCLOSURE

The disclosed systems and methods relate to semiconductor memories. More particularly, the disclosed systems and methods relate to high density memory structure.

BACKGROUND

Memory devices in integrated circuit (IC) chips are typically provided as internal storage units in a computing or communication device. In general, memory devices contain an array of memory cells arranged in rows and columns for storing data, and row and column decoder circuits coupled to the array of memory cells for accessing the array of memory cells in response to an external address. Each column of memory cells in the memory devices can be coupled to one or more I/O bit lines each for read/write of data from a memory cell designated by the external address.

Two types of memories used in computing or communication devices are random-access memory (RAM), such as dynamic random-access memory (DRAM) that stores each bit of data in a separate capacitor within the memory, and static random-access memory (SRAM), which uses latching circuitry to store each bit of data. Both types of memory are volatile, meaning that content of the memory will be lost when the chips are not powered. SRAMs have the advantageous feature of holding data without requiring a refresh and are commonly used in integrated circuits. Embedded SRAM is particularly popular in high speed communication, image processing and system on chip (SOC) applications. Another type of memory used in the computing or communication devices is flash memory, which is an electronic non-volatile computer storage device that can be electrically erased and reprogrammed and can retain stored information even when the chips are not powered.

The structure of a memory typically includes a plurality of bit cells disposed in rows and columns to form an array. Each bit cell includes a plurality of transistors coupled to bit lines and word lines that are used to read one or more bits of data from and write one or more bits of data to the bit cell.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

The inventors have discovered a novel memory structure that achieves high memory cell density and high efficiency for memory cell access. The memory structure can be used in a memory chip or an embedded memory within an application specific integrated circuit (ASIC). Using the memory structure, local bit lines of the memory cells are connected to global bit lines through switch elements (or switches), so that read and write signals to and from the memory cells can directly pass through the switches between the local bit lines and the global bit lines in a single I/O phase. In addition, various peripheral circuits of the memory, which can include, but are not limited to, a column multiplexer (decoder or selector), a bit line pre-charger, a sense amplifier, and an I/O write driver, can be shared among multiple banks or rows of memory cells to reduce area and cost of the memory.

As referred to hereinafter, "local bit lines" refer to bit lines, each of which connects directly to a plurality of memory cells in a memory, while "global bit lines" refer to bit lines, each of which connects to one or more local bit lines directly or via switches as described below. Dividing the bit lines into local and global levels helps to reduce the current load of memory on each bit line.

Figure 1A:
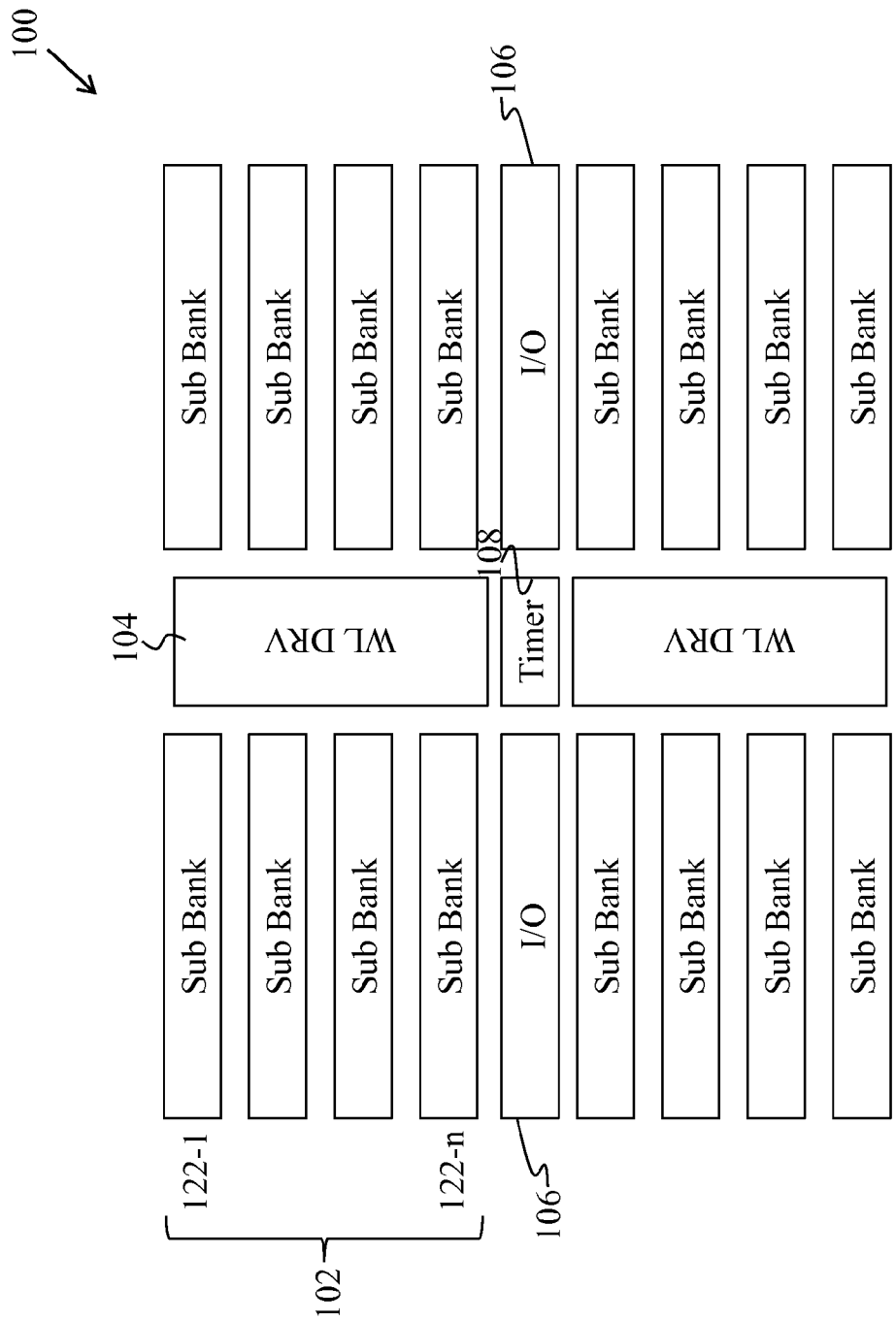
FIG. 1A illustrates one example of a structure of a memory chip, which includes multiple sections of sub banks in accordance with some embodiments.
Figure 1B:
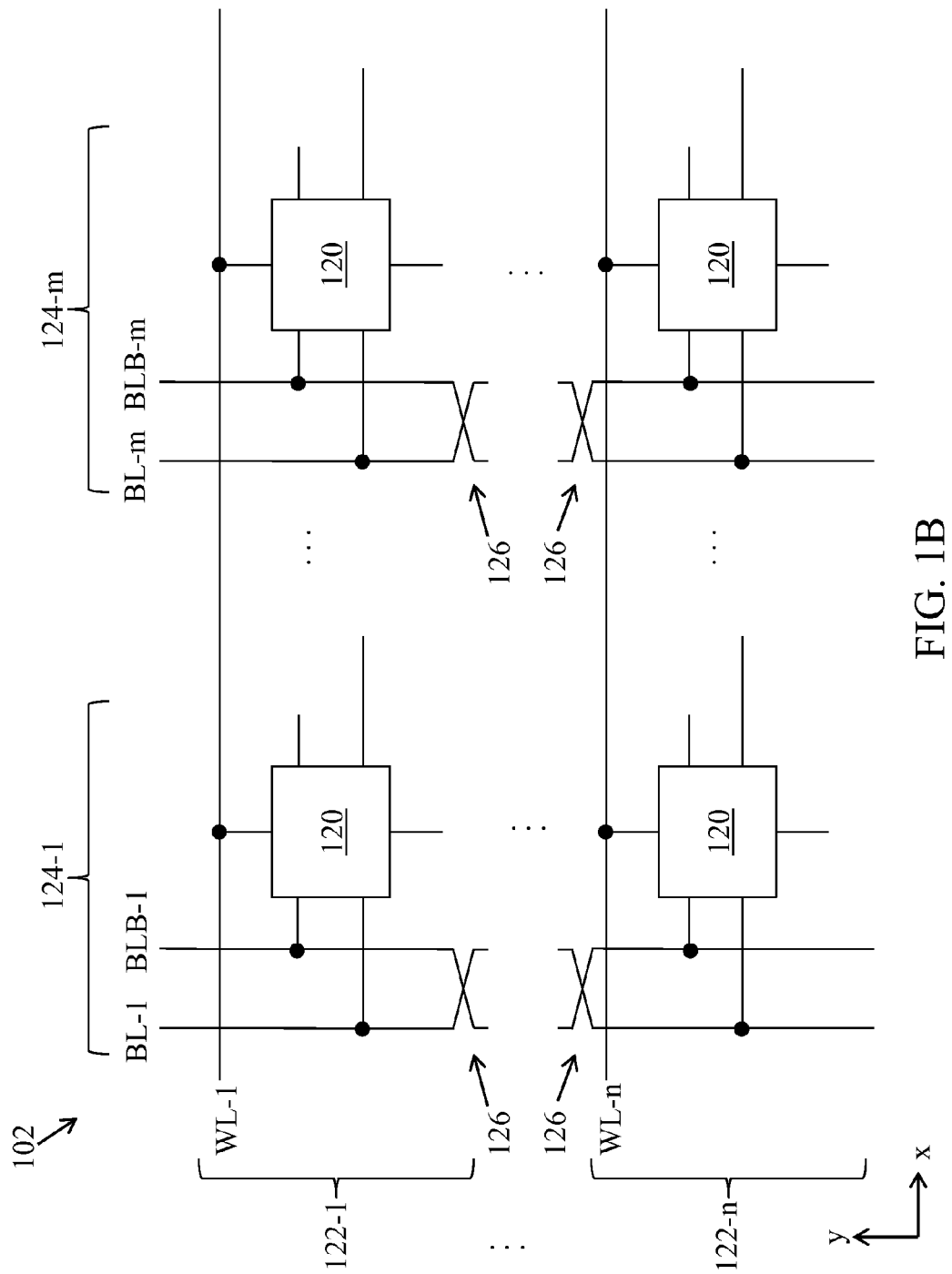
FIG. 1B further depicts the structure of each sub bank section, which comprises a plurality of sub banks in accordance with some embodiments.

FIG. 1A illustrates one example of a structure of memory 100, which includes multiple sections 102s of sub banks 122 (122-1 to 122-n), wherein each sub bank 122 includes one or more rows of memory bit cells (or memory cells) 120 (shown in FIG. 1B). WL drivers 104 are used to drive the word lines WL that control access to the memory bit cells 120. Also, in some embodiments, WL driver circuitry 104 further include row decoders (not shown), which receive row addresses and enable respective ones of the word lines WL to select one of the sub banks 122 in section 102 for read/write operations. All sub banks 122 in each section 102 share the same I/O circuitry 106, which includes various circuits to be shared among the sub banks 122 (discussed below in the description of FIG. 2). Timer circuitry 108 generates and provides clock signals for operation of memory chip 100, wherein a read or write operation to a memory bit cell is performed when the clock signal is high (logic "1") during a clock cycle.

FIG. 1B further depicts the structure of each sub bank section 102, which comprises a plurality of sub banks 122. As shown in FIG. 1B, each of the sub banks 122 (122-1 to 122-n) includes one or more rows of memory bit cells 120, which are arranged in a number of columns 124 (124-1 to 124-m). Each bit cell 120 can be selected by word line, WL-i, which extends horizontally across the memory array (i.e., in an x-direction) for read/write operations to the bit cells in a single row of sub bank 122-i. A pair of complementary local bit lines ("BL"), BL-j and BLB-j, for read/write bits of data from the memory bit cells 120, extend vertically across memory column 124-j of the memory array 100 (i.e., in a y-direction). In some embodiments, bit lines BL and BLB may include twists 126, which are used to mitigate coupling issues between the bit lines or balance the loading of BL and BLB.

Figure 1C:
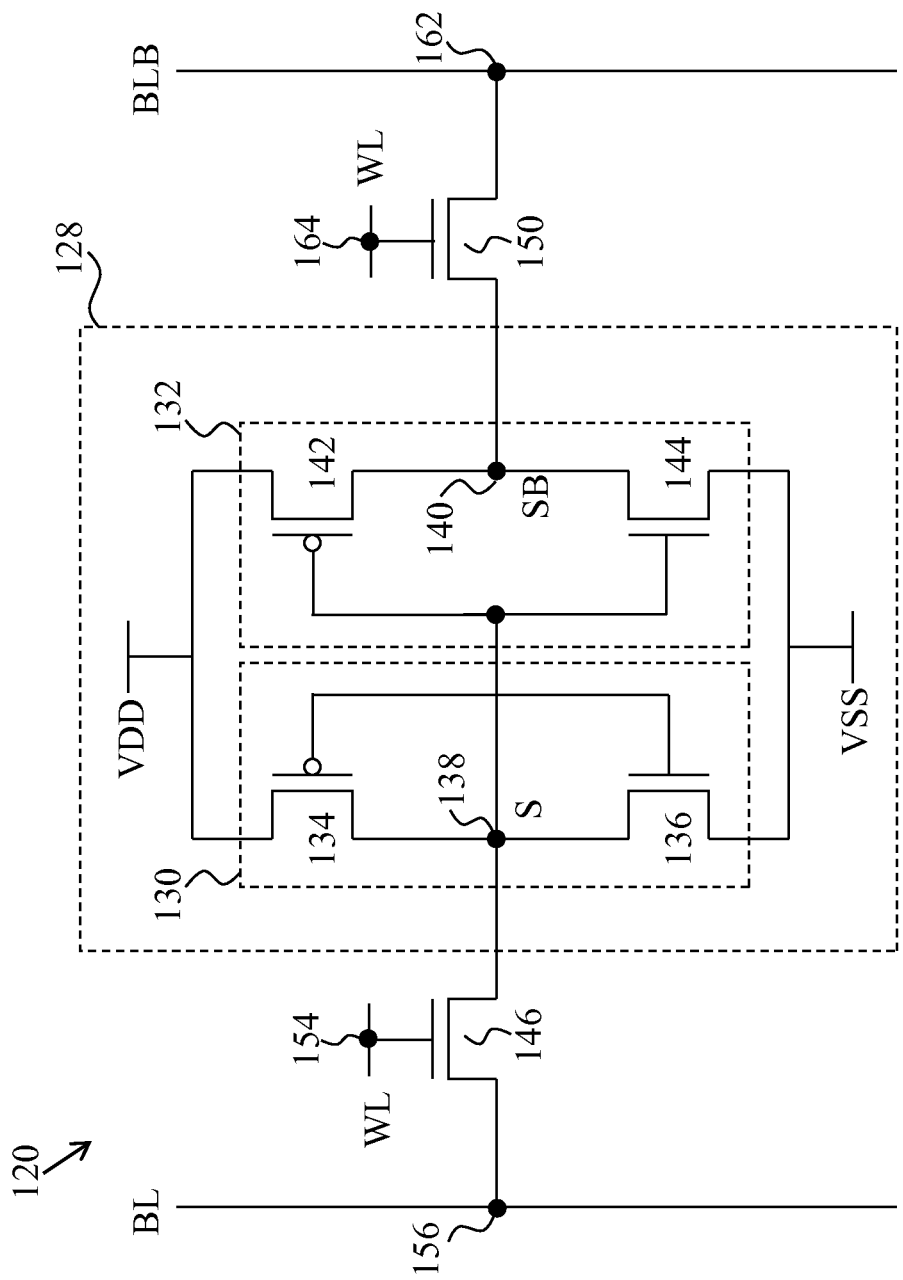
FIG. 1C illustrates one example of a six transistor memory bit cell in accordance with some embodiments.

One example of a six transistor ("6T") memory bit cell 120 is illustrated in FIG. 1C. Although a single port 6T memory bit cell is described as an example of the memory bit cell 120 hereinafter, one of ordinary skill in the art will understand that memory bit cells 120 can be formed using other numbers of MOS transistors including, but not limited to, 8T, 10T, 12T, and 14T, with single or dual port to name only a few examples.

As shown in FIG. 1C, memory bit cell 120 includes a latch 128 formed by a pair of cross-coupled inverters 130, 132 for storing a bit of data. Inverter 130 includes a PMOS transistor 134, which functions as a pull-up transistor, and an NMOS transistor 136, which functions as a pull-down transistor. PMOS transistor 134 has its source coupled to high-voltage source, VDD, and its drain coupled to a node 138 that serves as the output of inverter 130. NMOS transistor 136 of inverter 130 has its source coupled to low-voltage source VSS and its drain coupled to S node 138. The gates of transistors 134 and 136 are coupled together, which serves as the input of inverter 130 and the output of inverter 132.

As shown in FIG. 1C, inverter 132 includes a PMOS transistor 142, which serves as a pull-up transistor in some embodiments, and an NMOS transistor 144, which serves as a pull-down transistor in some embodiments. Transistor 142 has its source coupled to VDD, its gate coupled to S node 138, and its drain coupled to the drain of transistor 144. Transistor 144 of inverter 132 has its source coupled to VSS, its drain coupled to the drain of transistor 142, and its gate coupled to S node 138.

As shown in FIG. 1C, memory bit cell 120 also includes a plurality of pass transistors 146 and 150. In some embodiments, transistors 146 and 150 are NMOS transistors, although one skilled in the art understands that in other embodiments transistors 146 and 150 are implemented as PMOS transistors. Transistor 146 has its gate coupled to word line WL at node 154, its source coupled to S node 138, and its drain coupled to bit line BL at node 156. Transistor 150 has its source coupled to SB node 140, its drain coupled to bit line BLB at node 162, and its gate coupled to word line WL at node 164.

Figure 1D:
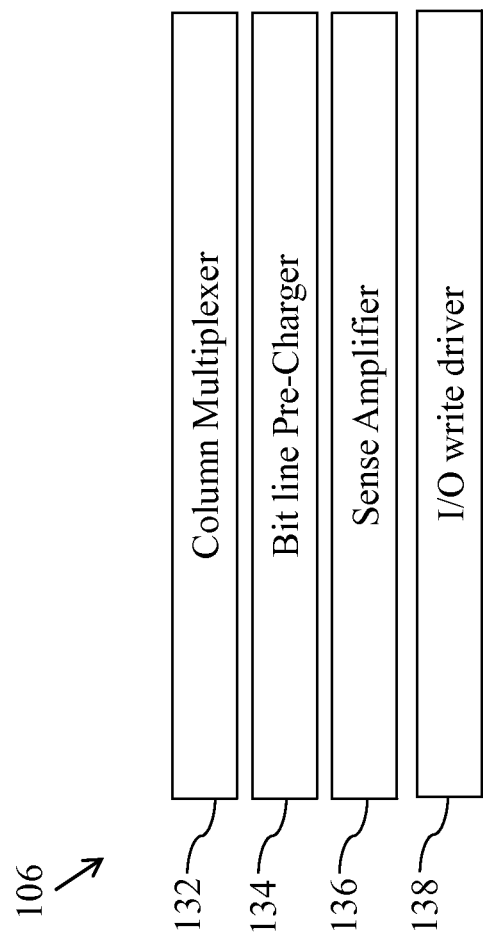
FIG. 1D further depicts various components in I/O circuitry to be shared among all sub banks of each section of the memory chip in accordance with some embodiments.

FIG. 1D further depicts various components in one embodiment of the I/O circuitry 106 of FIG. 1A, to be shared among all sub banks 122 of each section 102 of the memory chip 100. These shared components include but are not limited to, column multiplexer (decoder or selector) 132, bit line pre-charger 134, sense amplifier 136, and I/O write driver 138. Among these components, column multiplexer 132 receives column addresses and enables one of the memory columns 124 for read/write operations. Bit line pre-charger 134 pre-charges all bit lines (BLs and BLBs) of sub banks 122 to logic level "1" before a read/write operation is performed. Sense amplifier 134 amplifies small voltage swings of the bit lines to recognizable logic levels ("1" or "0"), so that data can be read properly from memory bit cells 120. I/O write driver 138 includes a plurality of I/O units (I/Os) each corresponding to a bit line pair BL/BLB of a memory column 124, for writing a bit of data to memory bit cell 120.

Figure 2:
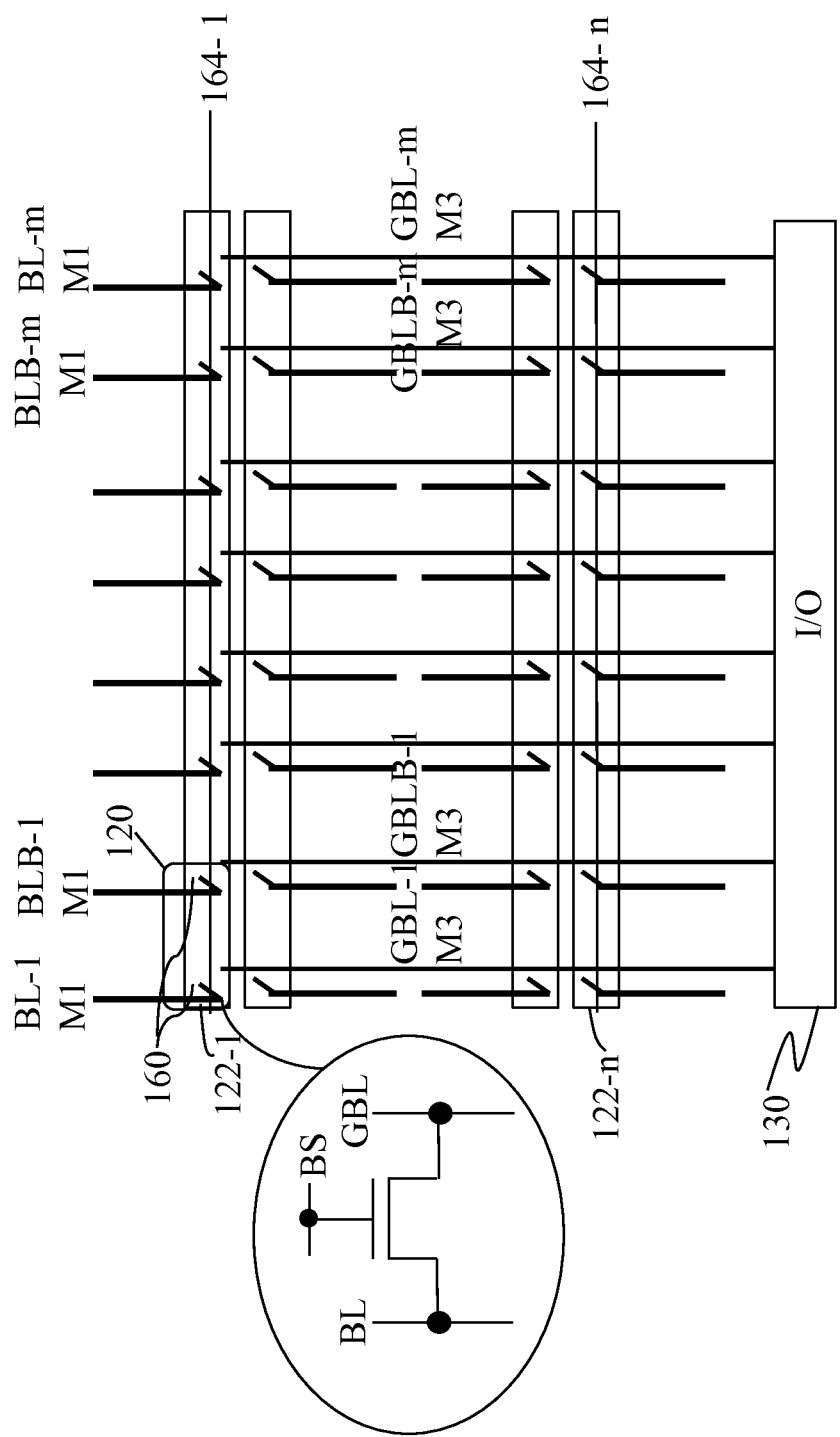
FIG. 2 illustrates an example of implementation of the sub banks, which enables local bit lines to connect with global bit lines via switch elements in accordance with some embodiments.

FIG. 2 illustrates an example of an implementation of the sub banks 122, which enables local bit lines BL/BLBs to connect with global bit lines GBL/GBLBs via switch elements 160. As shown in FIG. 2, each switch element 160 connects a local bit line BL or BLB with a corresponding global bit line GBL or GBLB and enables pass read/write data bit from/to memory bit cell 120 to global bit line GBL or GBLB. The switch elements 160 in each sub bank 122 are controlled by bank select signal BS carried by a respective bank selection signal line 164, which is enabled to select only one of the sub banks 122 at a time, while un-selecting other sub banks in the section. As such, only one sub bank 122 is selected during a read/write operation for data to be read from or written to the memory bit cells 120 in a row in the sub bank via global bit lines GBL or GBLB, and all switch elements 160 in the selected sub bank 122 are turned on at the same time.

As shown by the enlarged detail in FIG. 2, each switch element 160 can be implemented using, for non-limiting examples, NMOS, PMOS, or a combination of NMOS and PMOS transistors. In the example shown in FIG. 2, each switch element 160 can be implemented using a pass/transmission transistor having its gate coupled to bank selection signal line 164 carrying bank selection signal SB, and its source and drain coupled to BL and GBL, respectively.

As shown in FIG. 2, global bit lines GBL, GBLB are connected to and controlled by a single I/O circuitry 106, which in some embodiments, includes multiple I/O units (not shown) corresponding to memory columns 124. All sub banks 122 share various components, which include but are not limited to, column multiplexer 132, bit line pre-charger 134, sense amplifier 136, and I/O write driver 138 in the I/O circuitry 106 (FIG. 1D). For pre-charging of the bit lines, pre-charger 134 charges the global bit lines first. Switch elements 160 then enable the local bit lines to be pre-charged by their corresponding global bit lines during a bit line pre-charging phase. By integrating and sharing these I/O related components together in I/O circuitry 106, the structure of memory 100 saves the chip area occupied by these peripherals and reduces cost of the memory chip.

In some embodiments, the local bit lines BL, BLB and global bit lines GBL, GBLB are implemented on separate metal layers as shown in FIG. 2, where local bit lines BLs/BLBs are implemented on a first conductive line layer (e.g., metal layer M1) while global bit lines GBLs/GBLBs are implemented on a second conductive line layer (e.g., metal layer M3).

Figure 3:
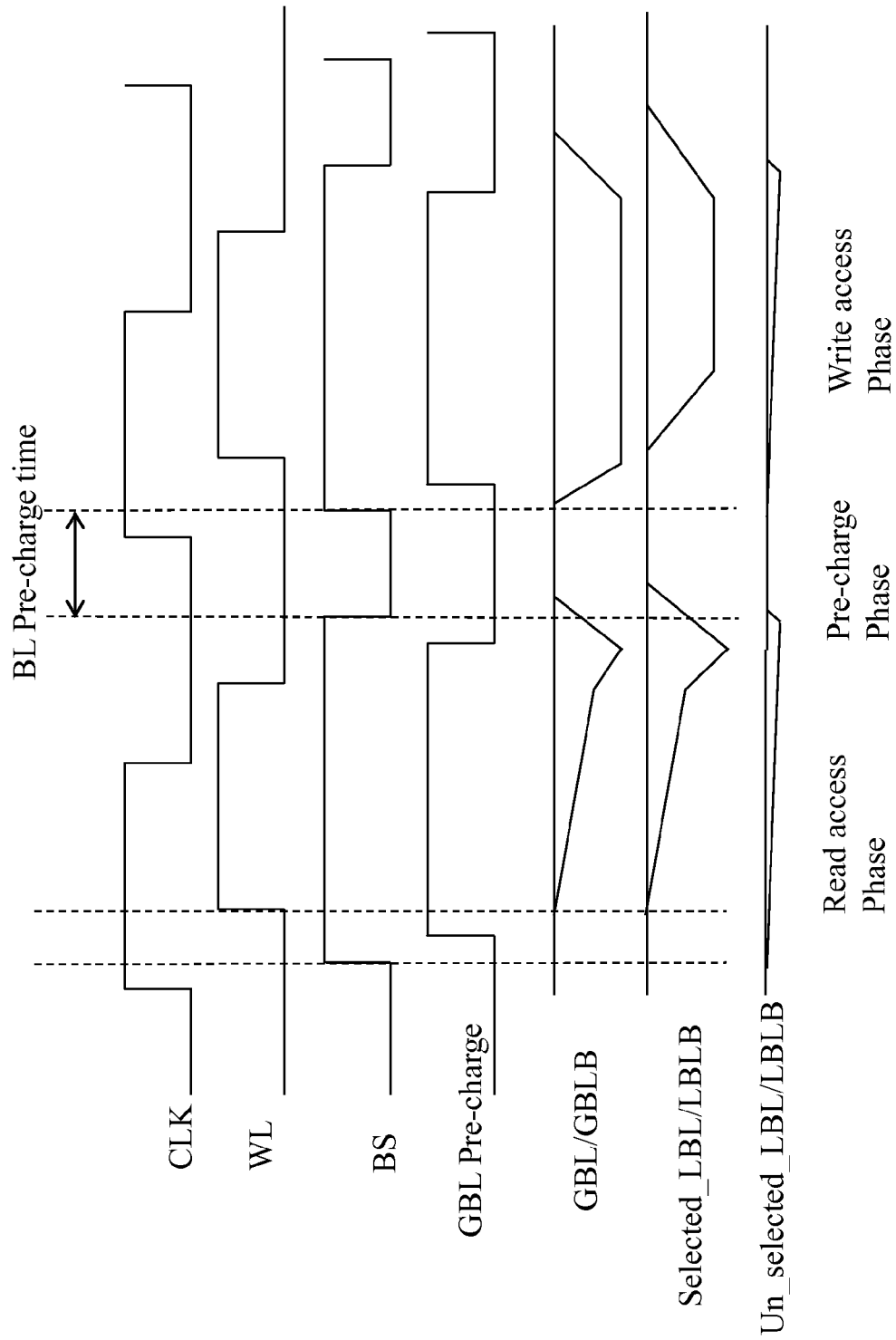
FIG. 3 shows an example of timing sequences of a plurality of signals for read/write operations of memory chip in accordance with some embodiments.

FIG. 3 shows an example of timing sequences of a plurality of signals for read/write operations of memory chip 100. As shown in the example of FIG. 3, CLK is a (binary) clock signal wherein a read/write operation to a memory bit cell 120 is performed when the clock signal is high (logic "1") during a clock cycle. WL is the word line enabling signal that enables read/write operation to memory bit cells in a row of the memory chip via local bit line BL/BLB. BS is the bank select signal that enables the switch elements and selects one of the sub banks 122 for data to be exchanged between the local bit line BL/BLB and the global bit line GBL/GBLB. GBL Pre-charge is a pre-charging signal that pre-charges global bit line GBL/GBLB, which then in turn charges its corresponding local bit line BL/BLB via a switch element during the bit line pre-charge phase of the memory operation. As shown in FIG. 3, the data on GBL/GBLB matches that of the selected local bit line BL/BLB during the read access phase and the write access phase of the memory operation, while the unselected local bit lines are "quiet."

Figure 4:
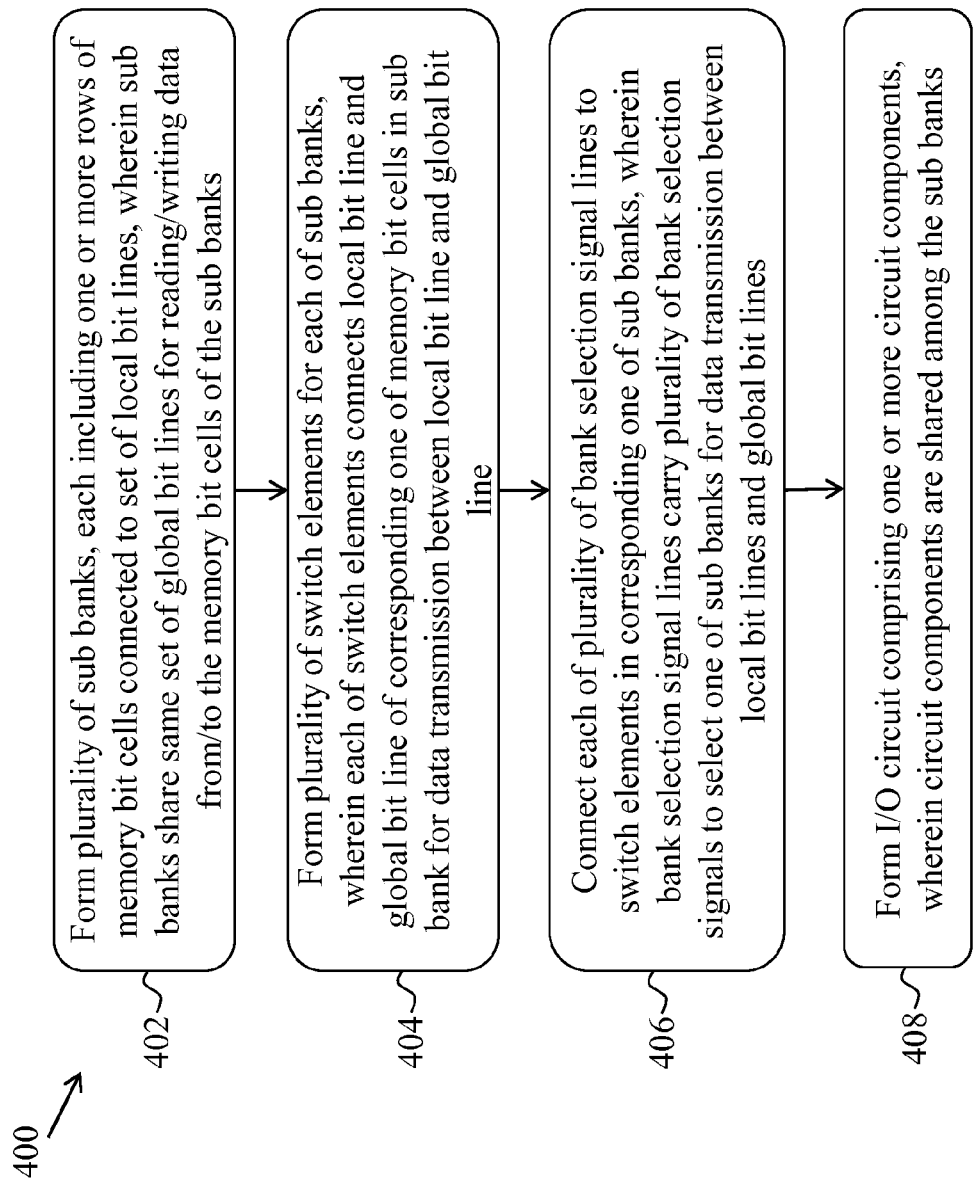
FIG. 4 is an example of a flow chart of a method for forming a high density structure of memory chip where local bit lines to the memory cells in the memory chip are connected to global bit lines through switch elements.

FIG. 4 is an example of a flow chart 400 of a method for forming a high density structure of memory chip where local bit lines BL, BLB coupled to the memory bit cells 120 in the memory 100 are connected to global bit lines GBL, GBLB through switch elements (or switches) 160 so that read and write signals to and from the memory bit cells 120 can be directly exchanged between the local bit lines BL, BLB and the global bit lines GBL, GBLB in a single I/O phase.

At step 402, a plurality of sub banks are formed in a memory, wherein each of the sub banks includes one or more rows of memory bit cells connected to a set of local bit lines wherein the sub banks share the same set of global bit lines for reading/writing data from/to the memory bit cells.

At step 404, a plurality of switch elements are included for each of the sub banks, wherein each of the switch elements connects the local bit line and the global bit line of a corresponding one of the memory bit cells in the sub bank for data transmission between the local bit line and the global bit line.

At step 406, a plurality of bank selection signal lines are each connected to the switch elements in a corresponding one of the sub banks, wherein the bank selection signal lines carry bank selection signals to select one of the sub banks for data transmission between the local bit lines and the global bit lines.

At step 408, one or more circuit components are included in one I/O circuitry, wherein the circuit components are shared among the sub banks.

With the high density structure of memory design described above, data can be read/written to the memory bit cells 120 in the sub banks 122 of the memory 100 directly between local bit lines BL, BLB and global bit lines GBL, GBLB in a single I/O phase, which provides fast read/write access to the memory 100. In addition, by integrating and sharing various I/O related circuit components in I/O circuitry 106 with all sub banks 122 in each section 102 of the memory 100, the structure achieves high density of memory bit cells in the memory and reduces the chip area and cost of the chip.

In some embodiments, a semiconductor memory comprises a plurality of sub banks each including one or more rows of memory bit cells connected to a set of local bit lines, wherein the sub banks share a same set of global bit lines for reading/writing data from/to the memory bit cells of the sub banks. The semiconductor memory chip further comprises a plurality of switch elements for each of the sub banks, wherein each of the switch elements connects the local bit line and the global bit line of a corresponding one of the memory bit cells in the sub bank for data transmission between the local bit line and the global bit line. The semiconductor memory chip further comprises a plurality of bank selection signal lines each connected to the switch elements in a corresponding one of the sub banks, wherein the bank selection signal lines carry a plurality of bank selection signals to select one of the sub banks for data transmission between the local bit lines and the global bit lines.

In some embodiments, the semiconductor memory chip further comprises an I/O circuit comprising one or more circuit components, wherein the circuit components are shared among the plurality of sub banks.

In some embodiments, each of the switch elements is a pass/transmission transistor.

In some embodiments, the switch elements enable pre-charging of the local bit lines by their corresponding global bit lines.

In some embodiments, the plurality of bank selection signals carried by the bank selection signal lines select only one of the sub banks for data transmission between the local bit lines and the global bit lines.

In some embodiments, the bank selection signal that selects the sub bank enables all of the switch elements in the sub bank for data transmission between the local bit lines and the global bit lines.

In some embodiments, the I/O circuit controls the set of global bit lines connecting to the memory bit cells via the local bit lines.

In some embodiments, the circuit components shared among the plurality of sub banks include one or more of a column multiplexer, a bit line pre-charger, a sense amplifier, and an I/O write driver in the I/O circuit.

In some embodiments, the set of local bit lines and the set of global bit lines are formed on separate metal layers of an integrated circuit containing the semiconductor memory.

In some embodiments, a semiconductor memory cell structure comprises a memory bit cell for storing one or more bits of data and a local bit line and a global bit line for reading/writing data from/to the memory bit cell. The semiconductor memory cell structure further comprises a switch element that connects the local bit line and the global bit line of the memory bit cell for data transmission between the local bit line and the global bit line. The semiconductor memory cell structure further comprises a bank selection signal line connected to the switch element, wherein the bank selection signal line carries a bank selection signal to enable transmission of data between the local bit lines and the global bit lines to/from the memory bit cell.

In some embodiments, the switch element is a pass/transmission transistor.

In some embodiments, the switch element enables pre-charging of the local bit line by the global bit line.

In some embodiments, a method for forming a semiconductor memory comprises forming a plurality of sub banks each including one or more rows of memory bit cells connected to a set of local bit lines, wherein the sub banks share a same set of global bit lines for reading/writing data from/to the memory bit cells of the sub banks. The method further comprises forming a plurality of switch elements for each of the sub banks, wherein each of the switch elements connects the local bit line and the global bit line of a corresponding one of the memory bit cells in the sub bank for data transmission between the local bit line and the global bit line. The method further comprises connecting each of a plurality of bank selection signal lines to the switch elements in each of the sub banks, wherein the bank selection signal lines carry a plurality of bank selection signals to select a corresponding one of the sub banks for data transmission between the local bit lines and the global bit lines.

In some embodiments, the method further comprises forming an I/O circuit comprising one or more circuit components, wherein the circuit components are shared among the plurality of sub banks.

In some embodiments, the method further comprises enabling pre-charging of the local bit lines by their corresponding global bit lines via the switch elements.

In some embodiments, the method further comprises selecting by the plurality of bank selection signals only one of the sub banks for data transmission between the local bit lines and the global bit lines.

In some embodiments, the method further comprises enabling all of the switch elements in the sub bank turned on for data transmission between the local bit lines and the global bit lines.

In some embodiments, the method further comprises controlling the set of global bit lines connecting to the memory bit cells via the local bit lines by the I/O circuit.

In some embodiments, the method further comprises sharing one or more of a column multiplexer, a bit line pre-charger, a sense amplifier, and an I/O write driver in the I/O component among the plurality of the sub banks.

In some embodiments, the method further comprises forming the set of local bit lines and the set of global bit lines on separate metal layers of an integrated circuit containing the semiconductor memory.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
   a plurality of sub banks, each sub bank comprising a row of a plurality of memory bit cells, each memory cell coupled to a corresponding local bit line of a plurality of local bit lines, each local bit line coupled to a respective global bit line of a plurality of global bit lines for reading/writing data from/to the plurality of memory bit cells of each sub bank;
   a plurality of switch elements for each of the sub banks, wherein each switch element couples a local bit line to a corresponding global bit line for data transmission between the local bit line and the global bit line;
   a plurality of bank selection signal lines, each bank selection signal line coupled to a plurality of switch elements in a corresponding one of the plurality of sub banks, wherein each bank selection signal line is configured to carry a bank selection signal to select one of the plurality of the sub banks for data transmission between the local bit lines coupled to the selected sub bank and the plurality of global bit lines.

2. The semiconductor memory of claim 1, further comprising:
   an I/O circuit comprising one or more circuit components, wherein the circuit components are shared among the plurality of sub banks.

3. The semiconductor memory of claim 1, wherein:
   each of the switch elements is a pass/transmission transistor.

4. The semiconductor memory of claim 1, wherein:
   the switch elements enable pre-charging of the local bit lines by their corresponding global bit lines.

5. The semiconductor memory of claim 1, wherein:
   the plurality of bank selection signals carried by the bank selection signal lines select only one of the sub banks for data transmission between the local bit lines and the global bit lines.

6. The semiconductor memory of claim 1, wherein:
   the bank selection signal that selects the sub bank enables all of the switch elements in the sub bank for data transmission between the local bit lines and the global bit lines.

7. The semiconductor memory of claim 1, wherein:
   the I/O circuit controls the set of global bit lines coupling to the memory bit cells via the local bit lines.

8. The semiconductor memory of claim 1, wherein:
   the circuit components shared among the plurality of sub banks include one or more of a column multiplexer, a bit line pre-charger, a sense amplifier, and an I/O write driver in the I/O circuit.

9. The semiconductor memory of claim 1, wherein:
   the set of local bit lines and the set of global bit lines are formed on separate metal layers of an integrated circuit containing the semiconductor memory.

10. A semiconductor memory cell structure, comprising:
    a plurality of memory bit cells for storing data and coupled to a common word line;
    a plurality of local bit lines and global bit lines for reading/writing data from/to the plurality of memory bit cells;
    a plurality of switch elements each coupled to a respective one of the plurality of local bit lines and the plurality of global bit lines; and
    a bank selection signal line coupled to the plurality of switch elements, wherein the bank selection signal line carries a bank selection signal to enable transmission of data between the plurality of local bit lines and respective ones of the plurality of global bit lines to/from respective ones of the plurality of memory bit cells.

11. The semiconductor memory cell of claim 10, wherein:
    the plurality of switch elements each comprise a pass/transmission transistor.

12. The semiconductor memory cell of claim 10, wherein:
    each switch element enables pre-charging of the local bit line by the global bit line.

13. A method for forming a semiconductor memory, comprising:
    forming a plurality of sub banks each comprising a row of a plurality of memory bit cells, each memory cell coupled to a corresponding local bit lines of a plurality of local bit lines, each local bit line coupled to a respective global bit line of a plurality of global bit lines for reading/writing data from/to the plurality of memory bit cells of each sub bank;
    forming a plurality of switch elements for each of the sub banks, wherein each switch element couples a local bit line to a corresponding global bit line for data transmission between the local bit line and the global bit line; and
    coupling each of a plurality of bank selection signal lines to the switch elements in a corresponding one of the sub banks, wherein each bank selection signal line is configured to carry a bank selection signal to select one of the sub banks for data transmission between the local bit lines coupled to the selected sub bank and the plurality of global bit lines.

14. The method of claim 13, further comprising:
    forming an I/O circuit comprising one or more circuit components, wherein the circuit components are shared among the plurality of sub banks.

15. The method of claim 13, further comprising:
    enabling pre-charging of the local bit lines by their corresponding global bit lines via the switch elements.

16. The method of claim 13, further comprising:
    selecting by the plurality of bank selection signals only one of the sub banks for data transmission between the local bit lines and the global bit lines.

17. The method of claim 16, further comprising:
    enabling all of the switch elements in the sub bank turned on for data transmission between the local bit lines and the global bit lines.

18. The method of claim 13, further comprising:
    controlling the set of global bit lines coupling to the memory bit cells via the local bit lines by the I/O circuit.

19. The method of claim 13, further comprising:
    sharing one or more of a column multiplexer, a bit line pre-charger, a sense amplifier, and an I/O write driver in the I/O component among the plurality of sub banks.

20. The method of claim 13, further comprising:
    forming the set of local bit lines and the set of global bit lines on separate metal layers of an integrated circuit containing the semiconductor memory.

* * * * *